(12) United States Patent
Goswick

(10) Patent No.: US 6,407,579 B1
(45) Date of Patent: Jun. 18, 2002

(54) FAST HIGH VOLTAGE LEVEL SHIFTER WITH GATE OXIDE PROTECTION

(75) Inventor: Jeffrey A. Goswick, Albuquerque, NM (US)

(73) Assignee: Koninklijke Philips Electronics N.V., New York, NY (US)

(*) Notice: Subject to any disclaimer, the term of this patent is extended or adjusted under 35 U.S.C. 154(b) by 0 days.

(21) Appl. No.: 09/597,195

(22) Filed: Jun. 20, 2000

Related U.S. Application Data

(60) Provisional application No. 60/177,245, filed on Jan. 20, 2000.

(51) Int. Cl.[7] .......................................... H03K 19/0175
(52) U.S. Cl. ............................. 326/81; 326/80; 326/83; 326/68; 326/63
(58) Field of Search ............................. 326/68, 86, 63, 326/81, 83, 17, 80

(56) References Cited

U.S. PATENT DOCUMENTS

| | | | |
|---|---|---|---|
| 5,440,249 A | | 8/1995 | Schucker et al. .............. 326/81 |
| 5,589,800 A | * | 12/1996 | Peterson ..................... 330/288 |
| 5,739,700 A | * | 4/1998 | Martin ......................... 326/80 |
| 5,852,366 A | | 12/1998 | Takahashi .................... 326/68 |
| 5,892,371 A | * | 4/1999 | Maley .......................... 326/81 |
| 5,923,211 A | * | 7/1999 | Maley et al. ................. 327/540 |
| 5,929,656 A | * | 7/1999 | Pagones ....................... 326/83 |
| 5,969,542 A | * | 10/1999 | Maley et al. ................. 326/81 |

FOREIGN PATENT DOCUMENTS

EP 0935346 A2 8/1999

OTHER PUBLICATIONS

IEEE journal of Solid–State Circuits; Richard J. Reay and Gregory T.A. Kovacs, An Unconditionally Stable Two–Stage CMOS Amplifier.
Att.Docket number Phn 17585= S/N 09/635115 Filed Aug. 09, 2000.

* cited by examiner

*Primary Examiner*—Michael Tokar
*Assistant Examiner*—Steven S. Paik
(74) *Attorney, Agent, or Firm*—Harold Tsiang

(57) ABSTRACT

A voltage level shifter circuit with gate oxide protection that can provide level shifted voltages for both read and write operations for applications in memory circuits, without increasing the circuit complexity. The level shifter circuit includes a voltage level shifter and an output stage which drives a load. The level shifter circuit can be used to drive voltages greater than the gate oxide voltage limit (i.e., level shift up for memory write operations), to drive level less than or equal to a digital supply level (i.e., level shift down or no level shift for standard memory read operations), and to drive voltages greater than digital supply level but less than the gate oxide voltage limit (i.e., fast level shift up for "booted read" operations in a memory when the digital supply voltage is too low for standard read access).

22 Claims, 4 Drawing Sheets

US 6,407,579 B1

FAST HIGH VOLTAGE LEVEL SHIFTER WITH GATE OXIDE PROTECTION

This application claims benefit of U.S. Provisional Application No. 60/177,245, filed on Jan. 20, 2000.

BACKGROUND OF THE INVENTION

The invention generally relates to electronic circuits and more particularly to voltage level shifters. Voltage level shifters have been used in many applications in which a voltage level higher than the one available is needed. For example, an integrated circuit may be required to drive a digital output pin with a logic one voltage level higher than the logic one voltage level used by that chip's internal logic.

For applications in non-volatile memory circuits, such as flash memory, EPROM, and pro $E^2$PROM, level shifters commonly drive the wordlines (i.e., the pass transistor gates of the memory cells). FIG. 1 shows a standard 6-transistor level shifter 10, which may be used for such application. For memory read operations, the required wordline driver output is usually less than or equal to the digital supply voltage Vdd (1.8 to 5.5V generally). For memory write operations, the required output may be 10V or higher. Therefore, the write operations require a level shifter, such as level shifter 10 in FIG. 1, to drive the word lines. To save chip area, and reduce circuit complexity, the level shifter used during writes is also used during reads, in which the required logic one output voltage usually must be less than or equal to Vdd., In such a case, the output level supply voltage, Vpp, tied to level shifter 10 is simply reduced during reads.

As semiconductor manufacturing processes continue to be scaled down, the thin insulating film of a MOS transistor (i.e., the gate oxide) became too thin to withstand the full high voltage required by some applications. Typically, the maximum gate oxide voltage limit, VgoxMax, is in the 7 to 20 V range, depending on the integrated circuit manufacturing process used. Therefore, level shifter 10 shown in FIG. 1 had to be modified.

FIG. 2 shows a modified level shifter 20 based on the circuit in FIG. 1. In level shifter 20, additional transistors Q2, Q3, Q10, and Q11 were added to limit the maximum voltage seen by any gate oxide in the circuit. This technique is commonly referred to as "cascading," and the added transistors are referred to as "cascode devices." In addition, two more transistors, Q7 and Q8, must be added to discharge nodes that can exceed voltage limitations due to capacitive coupling action. These two modifications double the transistor count of the modified circuit, and very significantly slow down the output switching speed, i.e., they increase the delay between a logic state transition on input A and the resulting output state transition.

To recover the speed, some designs use additional devices to form a second output drive path to drive the output during read operations in which the logic one output voltage must be less than or equal to Vdd. In those designs, the level shifting portion of the circuit formed by transistors Q1 through Q12 in FIG. 2 is used only during write operations in which the logic one output voltage must exceed Vdd, and is disabled otherwise. The second output drive path is composed of transistors Q13, Q14, Q15, and Q16. In this path, Q13 is used as the logic driver, while Q14 is used for mode control. Q15 is a cascode device that protects Q13 and Q14. Finally, Q16 is a discharge device similar in function to Q7 and Q8. Since Q13, Q14, and Q15 are in series, their widths must be relatively large to minimize the state change delay from input A to the output. This second output drive path adds more transistors, and additional control signal requirements since these additional transistors must be protected when the output level supply voltage Vpp exceeds the gate oxide voltage limits.

In FIG. 2, additional control and supply circuits, external to level shifter circuit 20, must be included to control the cascoding (i.e., to drive inputs B, C, and D) and to control the separate driver path (i.e., drive supply voltage Vrr and input E), thus increasing the total chip area and circuit complexity. Since the level shifting portion of the circuit is disabled during read operations, the modified circuit in FIG. 2 is incapable of driving voltages above Vdd for read operations. Due to the cascading devices, the level shifting portion is too slow to use for fast reads. This prohibits the use of this circuit as a memory wordline driver for applications where, e.g., wordline voltage boosting techniques are needed to allow fast memory read operations at low digital supply voltage Vdd.

Therefore, there is a need for an improved voltage level shifter that is capable of driving level shifted voltages fast enough for reads and with gate oxide protection for write operations, for applications in memory circuits, without increasing the circuit's size or complexity.

SUMMARY OF THE INVENTION

The present invention provides an improved voltage level shifter circuit. The circuit comprises an output stage that is configured to generate a desired level shifted voltage in response to a digital input; a voltage level shifter, operably coupled to the output stage, that is configured to receive a logic value and drive the output stage to cause the output stage to generate the desired level shifted voltage; an input stage, operably coupled to the level shifter, that is configured to receive the digital input and provide the logic value and a protection signal to the level shifter; and means, operably coupled to the input and output stages and the level shifter, for receiving the protection signal for providing voltage protection to the output stage and the level shifter when the desired level shifted voltage is greater than a maximum gate oxide voltage limit.

According to one aspect of the invention, when a digital supply voltage applied to the level shifter is less than a reference level and the desired level shifted voltage (e.g., at logic 1 voltage) is an elevated digital level voltage equal to the reference level, the output stage is further configured to receive an output stage supply voltage at the reference level that is less than the maximum gate oxide voltage limit. The elevated digital level voltage is equal to the output stage supply voltage.

According to another aspect of the invention, when the desired level shifted voltage is greater than the maximum gate oxide voltage limit, the output stage is further configured to receive an output stage supply voltage that is greater than the maximum gate oxide voltage limit. The desired level shifted voltage is equal to the output stage supply voltage.

According to a future aspect of the invention, when the desired level shifted voltage is less than a digital supply voltage applied to the level shifter, the output stage is further configured to receive an output stage supply voltage that is less than the digital supply voltage, and the desired level shifted voltage is equal to the output stage supply voltage.

According to a further aspect of the invention, when the desired level shifted voltage is equal to a digital supply voltage applied to the level shifter, the output stage is further configured to receive an output stage supply voltage that is equal to the digital supply voltage, and the desired level shifted voltage is equal to the output stage supply voltage.

The circuit of the invention is about 50% smaller than the conventional level shifter shown in FIG. 2, with fewer input control and supply lines, thus reducing circuit area and control complexity. Furthermore, only one regulated cascode voltage input is need, reducing implementation complexity.

In the circuit of the invention, the transient switching current is reduced due to the separation of a level shifting portion of the circuit from the output stage that is used to drive a load. Moreover, the propagation delay from the digital input to the level shifted output is reduced due to the removal of series cascode devices in the level shifting portion of the circuit (i.e. transistors Q2, Q3, Q10, and Q11 in FIG. 2 are no longer needed).

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 2:
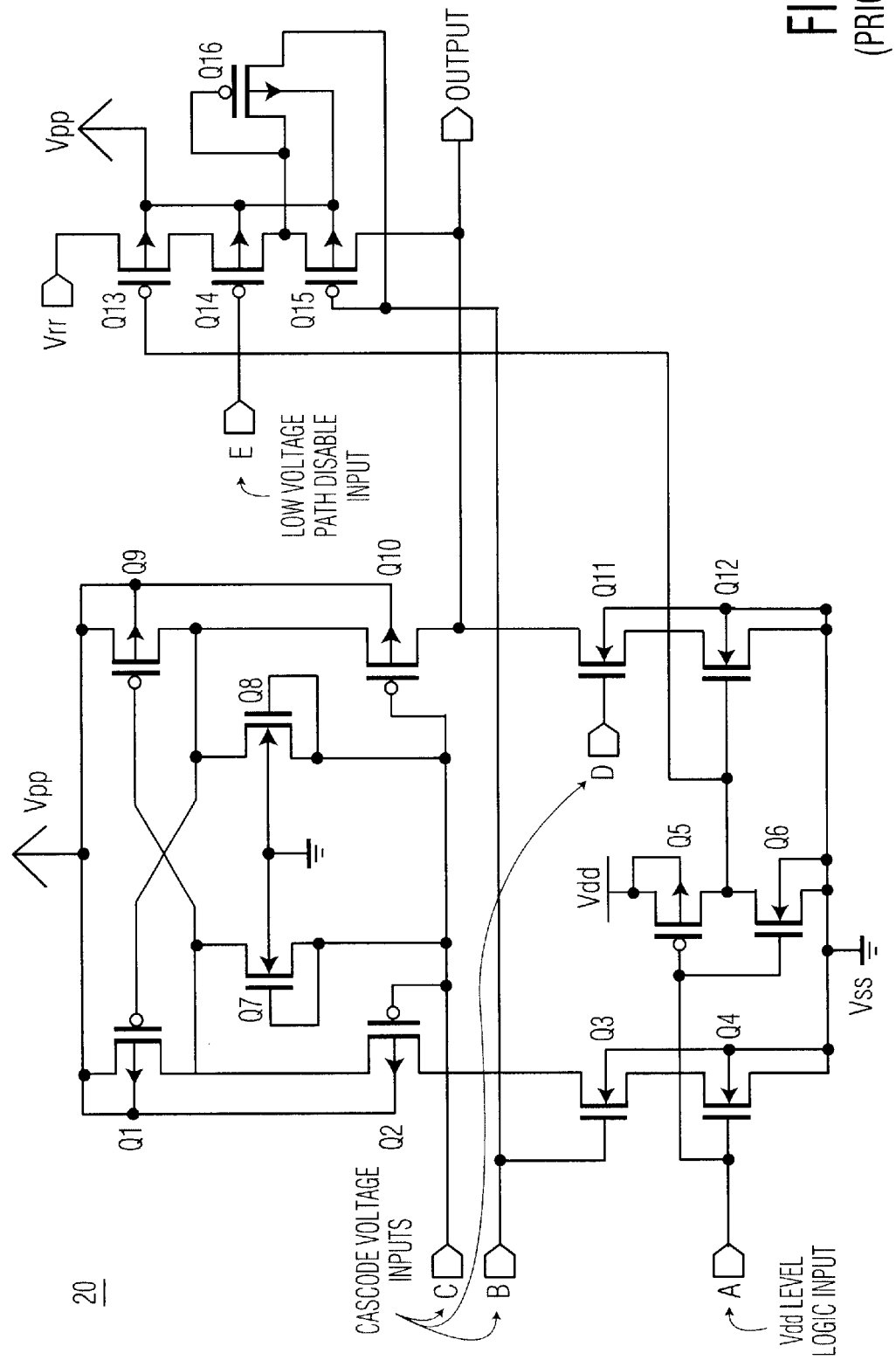
FIG. 2 shows a modified conventional voltage level shifter.
Figure 3:
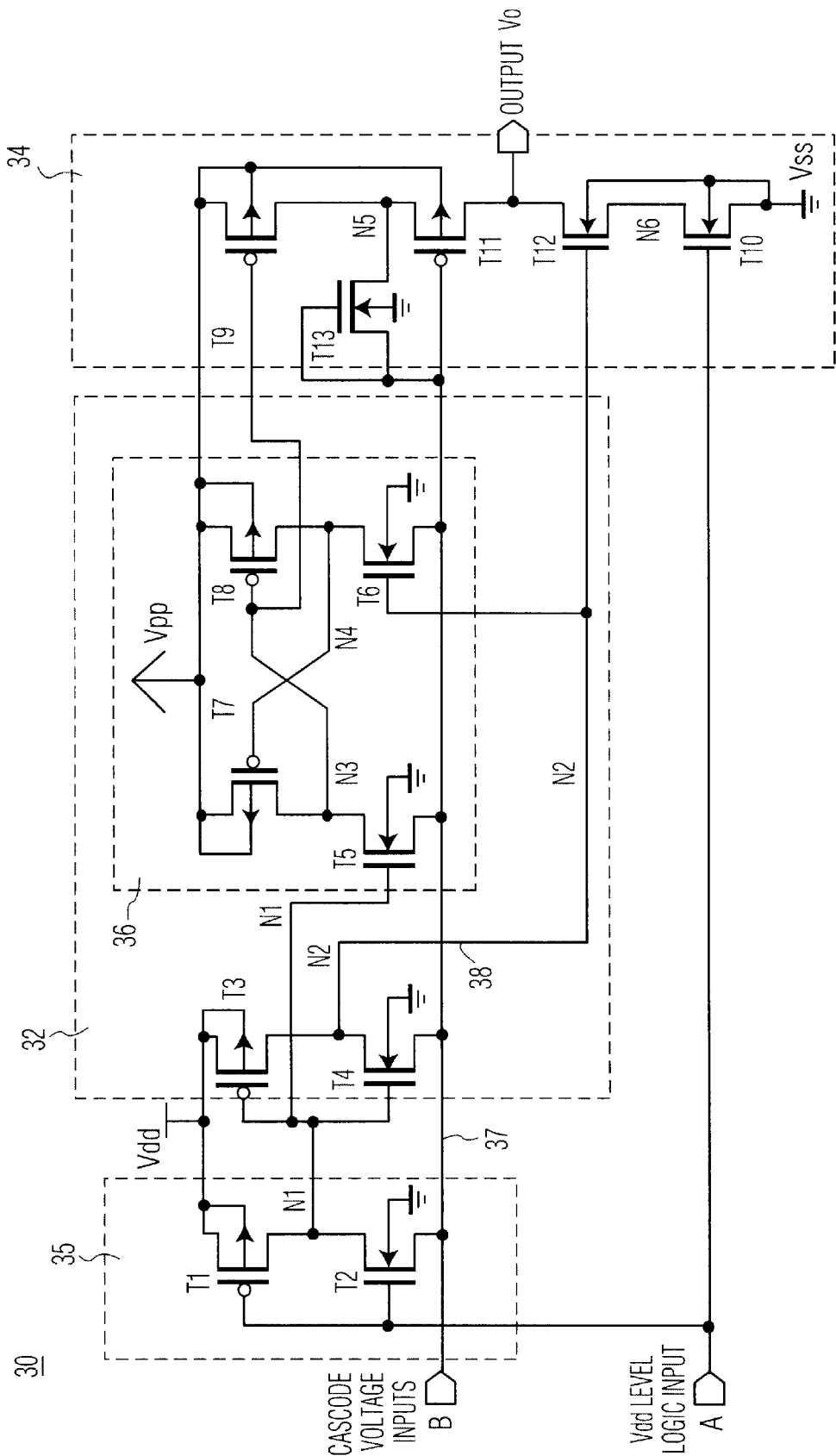
FIG. 3 shows a voltage level shifter circuit according to an embodiment of the invention.

FIG. 3 shows a voltage level shifter circuit 30 according to an embodiment of the invention. Circuit 30 includes a voltage level shifter 32 operably coupled to an output stage 34 and an input stage 35 in the form of an inverter. In this embodiment, the various cascode voltage inputs B, C, and D in FIG. 2 are replaced with signals that serve as cascoding voltages and logic signals as well as logic zero supply, thus reducing circuit complexity and transistor count. The separate read path (i.e., the second output drive path) in FIG. 2 is no longer needed since the logic/cascode signals can switch level shifter circuit 30 fast enough for read operations.

The following provides a functional description of voltage level shifter circuit 30. In one situation, to obtain output voltage levels less than the gate oxide voltage limit, VgoxMax, as in memory read operations, the supply voltage Vpp is set to be equal to or less than VgoxMax. Moreover, the cascode input voltage B is driven to Vss (logic zero) through input line 37 because no over-voltage protection is required. Since input B is driven to Vss, transistors T1 and T2 form a standard logic inverter. Similarly, transistors T3 and T4 also form a standard logic inverter 35. Transistors T3 through T8 function the same as a standard level shifter, as shown in FIG. 3 by reference numeral 32. Level shifter 32 includes a level shifting portion 36. In level shifter 32, node N1 is the digital input and node N4 is the level shifted output which is driven by T8 and T6.

By driving input B to Vss, the gate of T11 is also at Vss. Thus, T11 is on and may be considered a short between the output Vo and T9. T12 is controlled by a buffered version of input A, and is thus on or off whenever T10 is on or off. Therefore, T10 and T12 may be considered as one transistor connected between Vo and Vss, with its gate being driven by N2. Given the above, T10 and T12 are in parallel with T6; and T11 and T9 are also in parallel to T8. Therefore, the output Vo and N4 transition together, i.e., Vo is identical to N4, the level shifted output of the standard. level shifter.

Therefore, in this operating mode, e.g., for memory read operations, voltage level shifter 30 behaves like a standard level shifter with an inverter connected to the input. When the digital level input A is set to the digital supply Vdd (logic one), the output Vo is driven to Vss (logic zero). When input A is set to Vss, which is a logic zero, the output Vo is driven to a level shifted logic one, a voltage equal to Vpp. This operating mode can be used whenever the required output voltage that represents logic one is less than or equal to the gate oxide voltage limit (i.e., Vpp≦VgoxMax).

When input A changes voltage level from Vss to Vdd, the output Vo is switched from Vpp to Vss. To accomplish this, when A is equal to Vdd, node N1 turns off transistor T5 allowing node N3 to be pulled high, and node N2 turns on transistor T6 to pull node N4 low. T8, however, remains on until N3 rises to Vpp minus a PMOS threshold. N3 cannot begin to rise until T6 pulls N4 below Vpp minus a PMOS threshold. In this embodiment, T6 is designed to be large enough to sink more current than T8 is capable of delivering so that T6 is able to pull N4 low.

Figure 1:
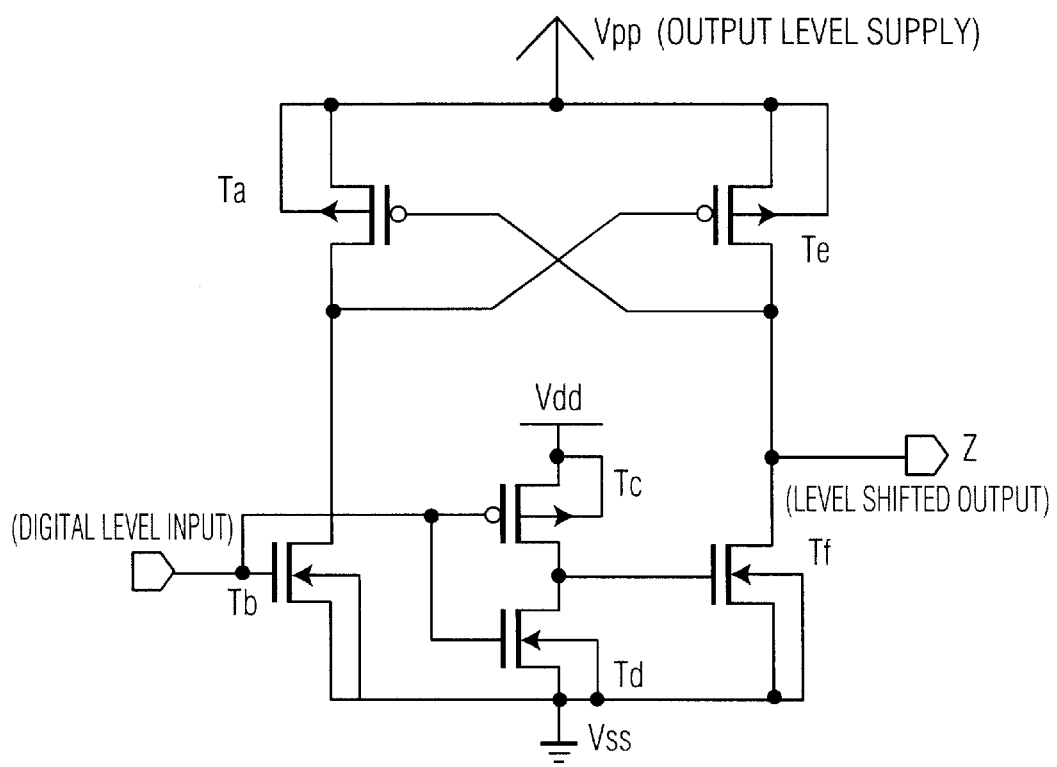
FIG. 1 shows a conventional voltage level shifter.

In a standard level shifter such as shown in FIG. 1, since Te and Tf (which respectively correspond to T8 and T6 in FIG. 3) drive the output of the level shifter, both devices must be large enough to drive the output load capacitance. As a result, the current through Te and Tf can be quite large during a high to low output transition in the standard level shifter.

One innovation in this embodiment of the invention is that level shifting portion 36 formed by T5, T6, T7, and T8 is separate from the devices that drive the output load, i.e., transistors T9, T10, T11, and T12. This design enhancement greatly improves the speed since T6 and T8 do not have to be large enough to drive the load, but only large enough to drive the gate of T9 in output stage 34. This also significantly reduces the transient switching current through T8 and T6.

In another situation, when a voltage greater than the gate oxide voltage limit VgoxMax is required on the output Vo, as required, e.g., in memory write operations, voltage level shifter circuit 30 must operate in such a way that all gate to source, gate to drain, and gate to channel voltages are limited to values less than VgoxMax. In this mode of operation and as an example, the following sequence may be applied. Input A is taken to a desired logic level, either logic zero or logic one. The cascode input B is raised to a voltage level that is less than or equal to the digital supply voltage Vdd minus an NMOS threshold. Then the supply input Vpp is raised to a desired logic one output voltage level VppHV, where VppHV>VgoxMax. If input A is a logic zero, the output Vo rises with Vpp. to If input A is a logic one, then the output Vo remains at Vss, i.e., logic zero. All inputs are stable until Vpp is reduced to some voltage less than VgoxMax. When Vpp is reduced to below VgoxMax, input B is driven to Vss and then the digital input value on input A is allowed to change logic levels.

When the cascoding input B is raised in the above, nodes N1 and N2 are equal to either the cascading voltage on input B or Vdd depending on the logic level at input A. Assuming that Vdd is less than or equal to VgoxMax, and Vpp minus the cascoding voltage on input B is less than or equal to VgoxMax minus an NMOS threshold voltage, all gate oxides are subjected to voltages less than or equal to VgoxMax.

A second innovation in this embodiment of the invention is that the source connections of the pulldowns T5 and T6 in level shifting portion 36 are connected to the cascode input B instead of Vss, and the gates of T5 and T6 are driven by voltages of either Vdd or the voltage on input B due to the inverters formed by T1,T2 and T3/T4. This allows for the removal of the series cascoding transistors (such as Q2, Q3, Q10, and Q11 in FIG. 2) from level shifting portion 36 of voltage level shifter 30.

The following illustrates this second innovation. In voltage level shifter 30, T5 and T6 are turned off when their gate voltages at nodes N1 and N2 respectively are equal to the voltage on input B, which represents a logic zero, so the voltages at N1 and N2 only need to move between Vdd and the voltage on input B. Since input B is greater than Vpp minus VgoxMax, the voltages at N1 and N2 cannot drop below Vpp minus VgoxMax. Therefore, T5 and T6 do not need cascode devices for gate to drain voltage protection when N4 or N5 rise above VgoxMax. Also, since input B is greater than Vpp−VgoxMax, N3 and N4 cannot be pulled down below Vpp−VgoxMax. Therefore, T7 and T8 do not need cascode devices for voltage protection and the gate to source and gate to drain voltages on T7 and T8 never exceed VgoxMax. Also, since Vdd is less than VgoxMax, the voltages at N1 and N2 cannot rise above VgoxMax. Therefore, T5 and T6 are not subjected to gate to source voltages greater than VgoxMax. In this way, the voltages at N1 and N2 function both as voltage protection control signals and as logic signals, where a logic zero value is represented by a voltage equal to the voltage on input B. The propagation delay from input A to the level shifted output Vo, the circuit area, the circuit complexity, and the number of required input signals and supply voltages are all reduced as a result of this second innovation.

In a specific example, assume Input A=5V, Vdd=5V, Input B=4V, Vpp=11V, VgoxMax=9V, and Vss=0V. Since the voltage on input A is 5V, T2 is on, T1 is off, and N1 is pulled to the 4V level on Input B. Since the voltage at N1 is equal to 4V, T3 is on, pulling the voltage at N2 to 5V. T1, T2, T3, and T4 have all their nodes less than or equal to Vdd, and are thus not a concern with respect to gate oxide voltage limitations. T5 is turned off by the voltage at N1 since its gate to source voltage is zero. T6 is turned on by the voltage at N2 (Vgs=1V) thus keeping the voltage at N4 pulled down to 4V. T7 is turned on (Vgs=4V−11V=−7V), keeping the voltage at N3 pulled to Vpp as Vpp rises. The voltage at N3 keeps T8 turned off. Thus for T5: Vgd=4−11=−7V, Vgs=0V, and Vgb=4−0=0V. For T6: Vgs=5−4=1V, Vgd=5−4=1V, and Vgb=5V. For T7: Vgs=4−11=−7V, Vgd=−7V, and Vgb=−7V. For T8: Vgs=0V, Vgd=11−4=7V, and Vgb=0V.

On the output stage, T9 is off. Thus, for T9: Vgs=0V, Vgb=0V. The voltage at N5 is pulled down by T11 to 4V plus a PMOS threshold, or about 5V. Therefore, Vgd on T9 is no more than 6V. For T11: Vgd=4−0=4V, Vgs=about −1V, and Vgb=4−11=−7V. For T13: Vgs=0V, Vgd=4−5=−1V, and Vgb=4V. For T12: Vgs=5V, Vgd=5V, Vgb=5V. For T10: Vgs=5V, Vgd=5V, and Vgb=5V. Therefore, no gate oxide sees more than 7V across it.

A similar analysis shows that no gate oxide sees more than 7V when 0V is on the digital input A when Vpp is ramped to 11V.

Note that the voltage levels on Vdd and input B determine the maximum voltage seen by a gate oxide. The maximum Vpp that can be tolerated by this voltage level shifter without violating the gate oxide voltage limit is achievable when:

Vdd=VgoxMax;

Input B=VgoxMax−Vtnbb, where Vtnbb is defined as the threshold voltage of an NMOS transistor with a negative VgoxMax substrate bias;

and

Vpp=(2*VgoxMax)−Vtnbb.

Note also that the gate of T12 may be tied to the digital supply, Vdd, instead of node N2, with no loss of functionality or oxide protection, but it may increase the delay between a state change on input A and the resulting transition on the output.

The level shifter will function correctly if input A transitions while Vpp is greater than VgoxMax and when input B is greater than 0V, but the circuit speed will be reduced. If the level shifter is operated in this mode, the delay from a transition on input A to the resulting state change on the output may be minimized by driving input B to a voltage equal to Vpp minus VgoxMax. Setting input B to such a voltage maximizes the value of Vdd minus the voltage on input B and thus improves the current drive capabilities of the inverter formed by T1 and T2, the inverter formed by T3 and T4, the pull-down transistor T5, and the pull-down transistor T6. This minimizes the propagation delay from input A to the level shifted output.

Figure 4:
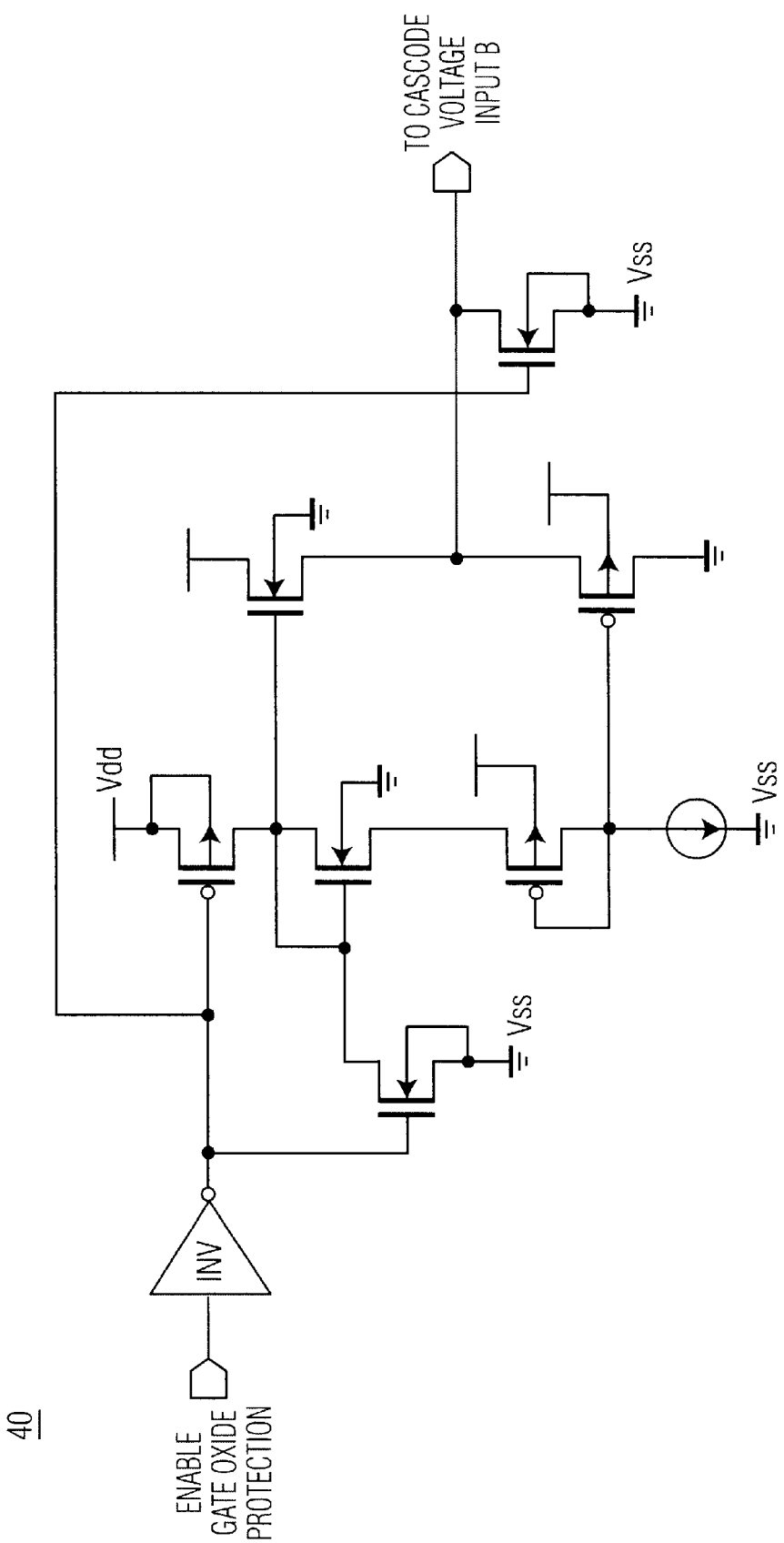
FIG. 4 shows an exemplary circuit for driving a cascode voltage input of the voltage level shifter circuit in FIG. 3.

An exemplary circuit 40 for driving input B is shown in FIG. 4. As will be understood by persons skilled in the art that there are other circuits that can be used to drive input B.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A circuit, comprising:

an output stage that is configured to generate a desired level shifted voltage in response to a digital input;

a voltage level shifter, operably coupled to the output stage, that is configured to receive a logic value and drive the output stage to cause the output stage to generate the desired level shifted voltage;

an input stage, operably coupled to the level shifter, that is configured to receive the digital input and provide the logic value and a protection signal to the level shifter; and means, operably coupled to the input and output stages and the level shifter, for receiving the protection signal for providing voltage protection to the output stage and the level shifter when the desired level shifted voltage is greater than a maximum gate oxide voltage limit;

wherein when a digital supply voltage applied to the level shifter is less than a reference level and the desired level shifted voltage is an elevated digital level voltage equal to the reference level, the output stage is further configured to receive an output stage supply voltage at the reference level that is less than the maximum gate oxide voltage limit, and wherein the elevated digital level voltage is equal to the output stage supply voltage.

2. The circuit of claim 1, wherein when the desired level shifted voltage is greater than the maximum gate oxide voltage limit, the output stage is further configured to receive an output stage supply voltage that is greater than the maximum gate oxide voltage limit, and wherein the desired level shifted voltage is equal to the output stage supply voltage.

3. The circuit of claim 1, wherein when the desired level shifted voltage is less than a digital supply voltage applied to the level shifter, the output stage is further configured to receive an output stage supply voltage that is less than the digital supply voltage, and wherein the desired level shifted voltage is equal to the output stage supply voltage.

4. The circuit of claim 1, wherein the input stage includes an inverter for receiving the digital input and for providing an inverted digital input as the logic value to the level shifter.

5. The circuit of claim 4, wherein the input stage includes means for receiving a protection signal for providing a protection voltage to the output stage.

6. The circuit of claim 1, wherein the level shifter further includes a level shifting portion that drives the output stage which is for driving a load.

7. The circuit of claim 6, wherein the level shifting portion includes means for receiving a protection signal to enable self protection from over-voltage conditions.

8. The circuit of claim 1, wherein the level shifter includes means for receiving the protection signal for providing a protection voltage to the output stage.

9. The circuit of claim 1, wherein the level shifter is configured to transmit both a protection voltage and the logic value to the output stage for increasing switching speed and reducing switching current.

10. A circuit, comprising:
an output stage that is configured to generate a desired level shifted voltage in response to a digital input;
a voltage level shifter, operably coupled to the output stage, that is configured to receive a logic value and drive the output stage to cause the output stage to generate the desired level shifted voltage;
an input stage, operably coupled to the level shifter, that is configured to receive the digital input and provide the logic value and a protection signal to the level shifter; and
means, operably coupled to the input and output stages and the level shifter, for receiving the protection signal for providing voltage protection to the output stage and the level shifter when the desired level shifted voltage is greater than a maximum gate oxide voltage limit;
wherein when the desired level shifted voltage is equal to a digital supply voltage applied to the level shifter, the output stage is further configured to receive an output stage supply voltage that is equal to the digital supply voltage, and wherein the desired level shifted voltage is equal to the output stage supply voltage.

11. A circuit, comprising:
an output stage that is configured to generate a desired level shifted voltage in response to a digital input;
a voltage level shifter, operably coupled to the output stage, that is configured to receive a logic value and drive the output stage to cause the output stage to generate the desired level shifted voltage;
an input stage, operably coupled to the level shifter, that is configured to receive the digital input and provide the logic value and a protection signal to the level shifter; and
means, operably coupled to the input and output stages and the level shifter, for receiving the protection signal for providing voltage protection to the output stage and the level shifter when the desired level shifted voltage is greater than a maximum gate oxide voltage limit;
wherein the input stage includes an inverter for receiving the digital input and for providing an inverted digital input as the logic value to the level shifter;
wherein the input stage is configured to transmit both a protection voltage and the inverted logic value to the level shifting portion through a single signal for increasing switching speed and reducing circuit area.

12. A circuit, comprising:
an output stage that is configured to generate a desired level shifted voltage in response to a digital input;
a voltage level shifter, operably coupled to the output stage, that is configured to receive a logic value and drive the output stage to cause the output stage to generate the desired level shifted voltage;
an input stage, operably coupled to the level shifter, that is configured to receive the digital input and provide the logic value and a protection signal to the level shifter; and
means, operably coupled to the input and output stages and the level shifter, for receiving the protection signal for providing voltage protection to the output stage and the level shifter when the desired level shifted voltage is greater than a maximum gate oxide voltage limit;
wherein when a digital supply voltage applied to the level shifter is less than a reference level and the desired level shifted voltage is an elevated digital level voltage equal to the reference level, the output stage is further configured to receive an output stage supply voltage at the reference level that is less than the maximum gate oxide voltage limit;
wherein when the desired level shifted voltage is greater than the maximum gate oxide voltage limit, the output stage is further configured to receive an output stage supply voltage that is greater than the maximum gate oxide voltage limit;
wherein the desired level shifted voltage is equal to the output stage supply voltage.

13. The circuit of claim 12, wherein when the desired level shifted voltage is less than the digital supply voltage applied to the level shifter, the output stage is further configured to receive an output stage supply voltage that is less than the digital supply voltage.

14. The circuit of claim 12, wherein when the desired level shifted voltage is equal to a digital supply voltage applied to the level shifter, the output stage is further configured to receive an output stage supply voltage that is equal to the digital supply voltage.

15. The circuit of claim 12, wherein the input stage is configured to transimit both a protection voltage and a logic value to the level shifting portion for increasing switching speed and reducing circuit area.

16. The circuit of claims 12, wherein the level shifter is configured to transmit both a protection voltage and a logic value to the output stage for increasing switching speed and reducing switching current.

17. A method, comprising the steps of:
generating a desired level shifted voltage in response to a digital input, using an output stage;
driving the output stage, using a voltage level shifter, to cause the output stage to generate the desired level shifted voltage;
providing a logic value and a protection signal to the level shifter, using an input stage;
providing voltage protection to the input and output stages and the level shifter when the desired level shifted voltage is greater than a maximum gate oxide voltage limit; and
receiving, by the output stage, an output stage supply voltage at the reference level that is less than the maximum gate oxide voltage limit when a digital supply voltage applied to the level shifter is less than a reference level and the desired level shifted voltage is an elevated digital level voltage equal to the reference level, and wherein the elevated digital level voltage is equal to the output stage supply voltage.

18. The method of claim 17, further comprising the step of receiving, by the output stage, an output stage supply voltage that is greater than the maximum gate oxide voltage limit when the desired level shifted voltage is greater than the maximum gate oxide voltage limit, and wherein the desired level shifted voltage is equal to the output stage supply voltage.

19. The method of claim 17, further comprising the step of receiving, by the output stage, an output stage supply voltage that is less than the digital supply voltage when the desired level shifted voltage is less than a digital supply voltage applied to the level shifter, and wherein the desired level shifted voltage is equal to the output stage supply voltage.

20. The method of claim 17, further comprising the step of transmitting, from the level shifter, both a protection voltage and a logic value to the output stage for increasing switching speed and reducing switching current.

21. The method of claim 17, further comprising the step of transmitting, from the input stage, both a protection voltage and a logic value to the level shifting portion for increasing switching speed and reducing circuit area.

22. A method, comprising the steps of:
generating a desired level shifted voltage in response to a digital input, using an output stage;
driving the output stage, using a voltage level shifter, to cause the output stage to generate the desired level shifted voltage;
providing a logic value and a protection signal to the level shifter, using an input stage;
providing voltage protection to the input and output stages and the level shifter when the desired level shifted voltage is greater than a maximum gate oxide voltage limit; and
receiving, by the output stage, an output stage supply voltage that is equal to the digital supply voltage wherein when the desired level shifted voltage is equal to a digital supply voltage applied to the level shifter, and wherein the desired level shifted voltage is equal to the output stage supply voltage.

* * * * *